United States Patent
Ok et al.

(10) Patent No.: US 10,453,844 B2
(45) Date of Patent: Oct. 22, 2019

(54) TECHNIQUES FOR ENHANCING VERTICAL GATE-ALL-AROUND FET PERFORMANCE

(71) Applicant: International Business Machines Corporation, Armonk, NY (US)

(72) Inventors: Injo Ok, Loudonville, NY (US); Choonghyun Lee, Rensselaer, NY (US); Soon-Cheon Seo, Glenmont, NY (US); Seyoung Kim, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/833,543

(22) Filed: Dec. 6, 2017

(65) Prior Publication Data

US 2019/0172830 A1      Jun. 6, 2019

(51) Int. Cl.
| | |
|---|---|
| *H01L 27/092* | (2006.01) |
| *H01L 29/78* | (2006.01) |
| *H01L 29/51* | (2006.01) |
| *H01L 21/8238* | (2006.01) |

(52) U.S. Cl.
CPC .. *H01L 27/0924* (2013.01); *H01L 21/823807* (2013.01); *H01L 21/823821* (2013.01); *H01L 21/823857* (2013.01); *H01L 21/823885* (2013.01); *H01L 29/51* (2013.01); *H01L 29/7827* (2013.01)

(58) Field of Classification Search
None
See application file for complete search history.

(56) References Cited

U.S. PATENT DOCUMENTS

| | | | |
|---|---|---|---|
| 6,297,531 | B2 | 10/2001 | Armacost et al. |
| 8,872,172 | B2 | 10/2014 | Cheng et al. |
| 8,936,976 | B2 | 1/2015 | Radosavljevic et al. |
| 9,306,022 | B1 | 4/2016 | Oh |
| 9,312,183 | B1 | 4/2016 | Kim et al. |
| 9,589,851 | B2 | 3/2017 | Bu et al. |

(Continued)

OTHER PUBLICATIONS

Kita et al., "Intrinsic Origin of Electric Dipoles Formed at High-k/SiO2 Interface," 2008 IEEE International Electron Devices Meeting, pp. 29-32 (Dec. 2008).

(Continued)

*Primary Examiner* — Telly D Green
(74) *Attorney, Agent, or Firm* — Vazken Alexanian; Michael J. Chang, LLC (57) ABSTRACT

Techniques for enhancing VFET performance are provided. In one aspect, a method of forming a VFET device includes: patterning a fin(s) in a substrate; forming bottom source and drains at a base of the fin(s); forming bottom spacers on the bottom source and drains; forming a gate along sidewalls of the fin(s); recessing the gate to expose a top portion of the fin(s); forming an oxide layer along the sidewalls of the top portion of the fin(s); depositing a charged layer over the fin(s) in contact with the oxide layer, wherein the charged layer induces an opposite charge in the top portion of the fin(s) forming a dipole; forming top spacers above the gate; and forming top source and drains above the top spacers. A method of forming a VFET device having both NFETs and PFETs is also provided as are VFET devices formed by the present techniques.

8 Claims, 10 Drawing Sheets

(56) References Cited

U.S. PATENT DOCUMENTS

| | | | |
|---|---|---|---|
| 9,620,612 B2 | 4/2017 | Xu et al. | |
| 9,627,511 B1* | 4/2017 | Cheng | H01L 29/66553 |
| 9,735,111 B2 | 8/2017 | Ando et al. | |
| 9,773,708 B1* | 9/2017 | Zhang | H01L 21/82382 |
| 9,773,901 B1* | 9/2017 | Gluschenkov | H01L 29/7827 |
| 9,780,208 B1* | 10/2017 | Xie | H01L 29/0847 |
| 9,972,494 B1* | 5/2018 | Bentley | H01L 21/28123 |
| 10,014,409 B1* | 7/2018 | Wu | H01L 29/7827 |
| 10,020,381 B1* | 7/2018 | Fan | H01L 29/66666 |
| 2015/0035073 A1 | 2/2015 | Ando et al. | |
| 2017/0352742 A1* | 12/2017 | Cheng | H01L 29/66666 |
| 2018/0006025 A1* | 1/2018 | Hook | H01L 27/088 |
| 2018/0019337 A1* | 1/2018 | Xie | H01L 29/0847 |
| 2018/0122913 A1* | 5/2018 | Xie | H01L 29/41791 |
| 2018/0190817 A1* | 7/2018 | Wu | H01L 29/7827 |
| 2018/0226402 A1* | 8/2018 | Xie | H01L 27/0886 |
| 2018/0240873 A1* | 8/2018 | Cheng | H01L 29/0847 |
| 2018/0261513 A1* | 9/2018 | Cheng | H01L 21/823487 |

OTHER PUBLICATIONS

B.E. Coss et al., "CMOS band-edge Schottky barrier heights using dielectric-dipole mitigated (DDM) metal/Si for source/drain contact resistance reduction," Symposium on VLSI Technology, Jun. 2009, pp. 104-105.

* cited by examiner

TECHNIQUES FOR ENHANCING VERTICAL GATE-ALL-AROUND FET PERFORMANCE

FIELD OF THE INVENTION

The present invention relates to vertical field-effect transistor (VFETs) devices, and more particularly, to techniques for enhancing VFET performance by forming dipoles in undoped regions at the tops of the VFETs.

BACKGROUND OF THE INVENTION

As opposed to planar complementary metal oxide semiconductor (CMOS) devices, vertical field effect transistor (VFET) devices are oriented with a vertical fin channel disposed on a doped bottom source and drain and a doped top source and drain disposed on the vertical fin channel. A gate is present along sidewalls of the vertical fin channel. Advantageously, VFETs are being explored as a viable device option for continued CMOS scaling beyond the 7 nanometer (nm) technology node.

The process flow for a VFET has strict constraints on the thermal budget for downstream processing steps such as top source and drain epitaxy, junction anneal, and dopant activation anneal because the high-κ metal gate is already in place. As a result, undoped regions are inevitably formed at the tops of the device between the vertical fin channel and the top source and drain.

The high resistance in these undoped regions severely degrades device performance. The impact becomes even more severe when the channel length is scaled for fins of a given height, i.e., reducing the channel length for fins of a given height will increase the length of the undoped region at the tops of the fins.

Therefore, VFET device designs and techniques for fabrication thereof with improved performance would be desirable.

SUMMARY OF THE INVENTION

The present invention provides techniques for enhancing vertical field effect transistor (VFET) performance by forming dipoles in undoped regions at the tops of the VFETs. In one aspect of the invention, a method of forming a VFET device is provided. The method includes: patterning at least one fin in a substrate; forming bottom source and drains at a base of the at least one fin; forming bottom spacers on the bottom source and drains; forming a gate along sidewalls of the at least one fin; recessing the gate to expose a top portion of the at least one fin; forming an oxide layer along the sidewalls of the top portion of the at least one fin; depositing a charged layer over the at least one fin in contact with the oxide layer, wherein the charged layer induces an opposite charge in the top portion of the at least one fin forming a dipole; forming top spacers above the gate; and forming top source and drains above the top spacers.

In another aspect of the invention, another method of forming a VFET device is provided. The method includes: patterning at least one n-channel field-effect transistor (NFET) fin and at least one p-channel FET (PFET) fin in a substrate; forming NFET bottom source and drains at a base of the at least one NFET fin and PFET bottom source and drains at a base of the at least one PFET fins; forming bottom spacers on the NFET and PFET bottom source and drains; forming gates along sidewalls of the at least one NFET fin and along sidewalls of the at least one PFET fin; recessing the gates to expose top portions of the at least one NFET fin and the at least one PFET fin; forming an oxide layer along the sidewalls of the top portions of the at least one NFET fin and the at least one PFET fin; selectively forming a positively charged layer over the at least one NFET fin in contact with the oxide layer along the sidewalls of the top portions of the at least one NFET fin, wherein the positively charged layer induces a negative charge in the top portion of the at least one NFET fin forming a first dipole; selectively forming a negatively charged layer over the at least one PFET fin in contact with the oxide layer along the sidewalls of the top portions of the at least one PFET fin, wherein the negatively charged layer induces a positive charge in the top portion of the at least one PFET fin forming a second dipole; forming top spacers above the gate; and forming NFET and PFET top source and drains above the top spacers.

In yet another aspect of the invention, a VFET device is provided. The VFET device includes: at least one fin patterned in a substrate; bottom source and drains at a base of the at least one fin; bottom spacers on the bottom source and drains; a gate along sidewalls of the at least one fin; an oxide layer formed along the sidewalls of a top portion of the at least one fin; a charged layer disposed over the at least one fin in contact with the oxide layer, wherein the charged layer induces an opposite charge in the top portion of the at least one fin forming a dipole; top spacers above the gate; and top source and drains above the top spacers.

A more complete understanding of the present invention, as well as further features and advantages of the present invention, will be obtained by reference to the following detailed description and drawings.

DETAILED DESCRIPTION OF PREFERRED EMBODIMENTS

As will be described in detail below, fins serve as the basis for a vertical field effect transistor (VFET) device. Bottom and top (doped) source and drains are formed at the bottoms and tops of the fins, respectively. A portion of the fins in between the bottom and top source and drains serve as vertical fin channels. Ideally, bottom/top source and drain doping in the fin extends to the bottom/top junctions with the vertical fin channel. However, as provided above, due to thermal constraints after high-κ metal gate formation, undoped regions are inevitably formed at the tops of the fins, i.e., between the vertical fin channel and the top source and drains. This problem does not exist for the bottom source and drains since they are formed prior to the high-κ metal gate, and thus do not have the same thermal budget constraints. These undoped regions increase resistance at the tops of the VFET devices and thereby degrade performance.

Advantageously, provided herein are techniques for forming a dipole along these top undoped regions of the fins to increase current flow through these regions, thereby enhancing device performance. This dipole is formed via the placement of a layer having a (positive (+) or negative (−)) charge along the undoped regions at the tops of the fins. This charged layer will induce a charge of the opposite polarity in the fin, i.e., a positive (+) charged layer will induce a negative charge in the undoped fin region, and vice versa. As such, a surface dipole will be formed along the undoped regions at the tops of the fins in between the vertical fin channels and the top source and drains. The undoped regions at the tops of the fins have high resistance. However, by introducing opposite dipoles in the area between channel and top source and drains, the electron (or hole) can flow through the dipole region efficiently with low resistance.

The charge of the (dipole moment-inducing) layer will be reversed for n-channel FET (NFET) and p-channel FET (PFET) devices. For instance, as will be described in detail below, a positively charged layer can be used for the NFET devices, while a negative charged layer can be used for the PFET devices. This will induce a negative or positive charge in the undoped regions at the tops of the fins in the NFET and PFET devices, respectively.

By way of example only, suitable negatively charged (dipole moment-inducing) materials include, but are not limited to, aluminum oxide ($Al_2O_3$), titanium oxide ($TiO_2$), zirconium oxide ($ZrO_2$), hafnium oxide ($HfO_2$) and/or magnesium oxide (MgO). The magnitude of the interface dipole moment induced by each of these materials decreases in the order they are presented, with $Al_2O_3$ inducing a dipole moment of the greatest magnitude and MgO the least. See, for example, FIG. 6 in Kita et al., "Intrinsic Origin of Electric Dipoles Formed at High-k/$SiO_2$ Interface," 2008 IEEE International Electron Devices Meeting, pgs. 29-32 (Dec. 2008) (hereinafter "Kita"), the contents of which are incorporated by reference as if fully set forth herein. Suitable positively charged (dipole moment-inducing) materials include, but are not limited to, strontium oxide (SrO), lanthanum oxide ($La_2O_3$), lutetium oxide ($Lu_2O_3$) and/or yttrium oxide ($Y_2O_3$). The magnitude of the interface dipole moment induced by each of these materials decreases in the order they are presented, with SrO inducing a dipole moment of the greatest magnitude and $Y_2O_3$ the least. See, for example, FIG. 6 of Kita.

An exemplary embodiment, in accordance with the present techniques, for forming a VFET device with a dipole induced at the tops of the fins is now described by way of reference to FIGS. 1-20. In the example that follows, an NFET is formed alongside a PFET. This is done merely to illustrate the compatibility of the process with co-fabricating both types of devices on the same wafer. However, it is to be understood that the present techniques can be implemented in the same manner described to instead form one type of device NFET or PFET exclusively, in multiple or singularly.

Figure 1:
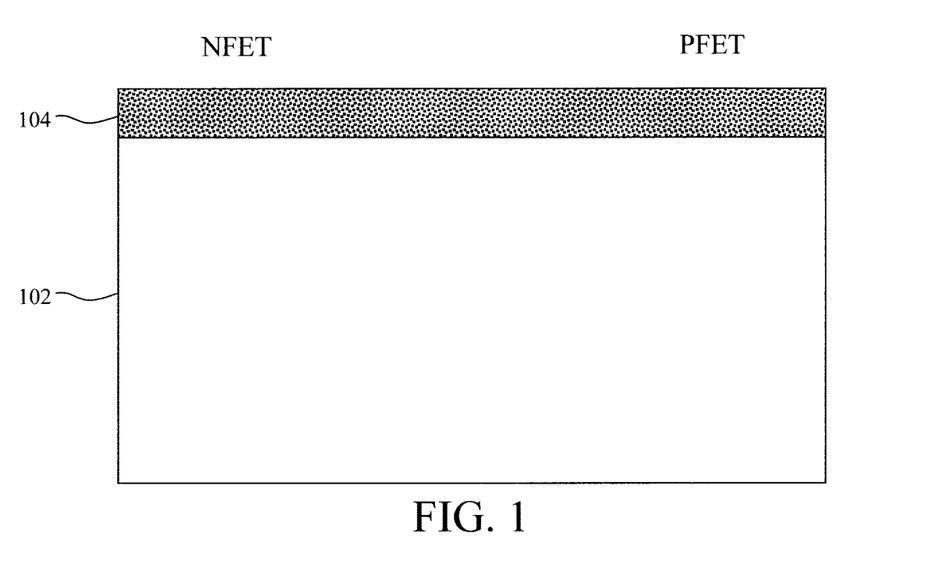
FIG. 1 is a cross-sectional diagram illustrating a hardmask layer having been formed on a substrate according to an embodiment of the present invention.
Figure 2:
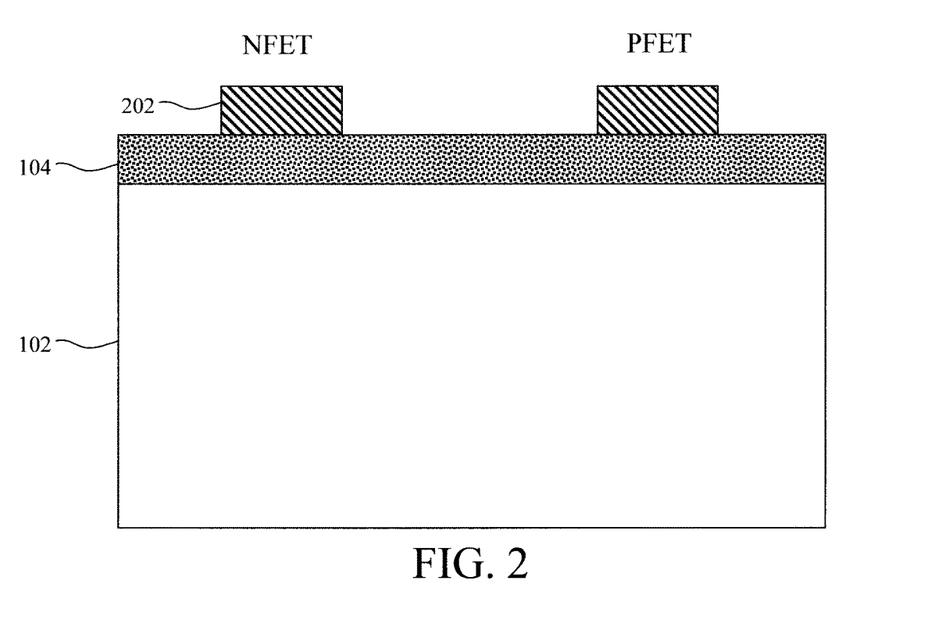
FIG. 2 is a cross-sectional diagram illustrating at least one mandrel having been formed on the hardmask layer according to an embodiment of the present invention.
Figure 3:
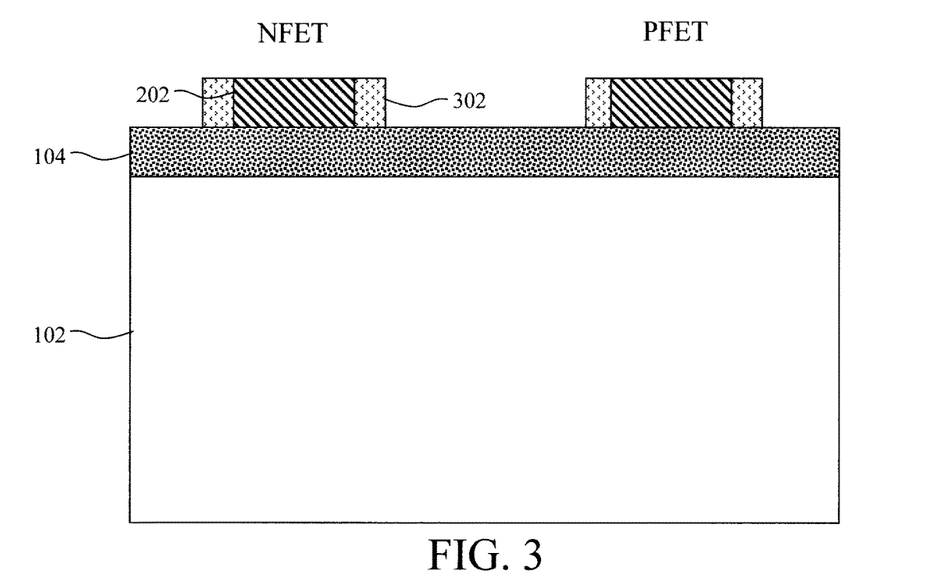
FIG. 3 is a cross-sectional diagram illustrating sidewall spacers having been formed on opposite sides of the mandrels according to an embodiment of the present invention.
Figure 4:
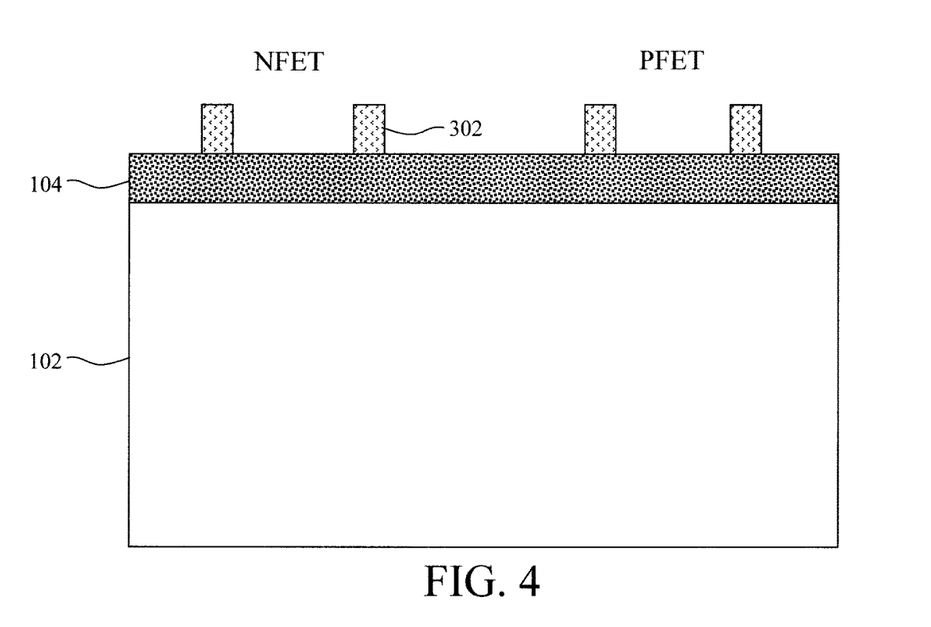
FIG. 4 is a cross-sectional diagram illustrating the mandrels having been removed selective to the spacers according to an embodiment of the present invention.
Figure 5:
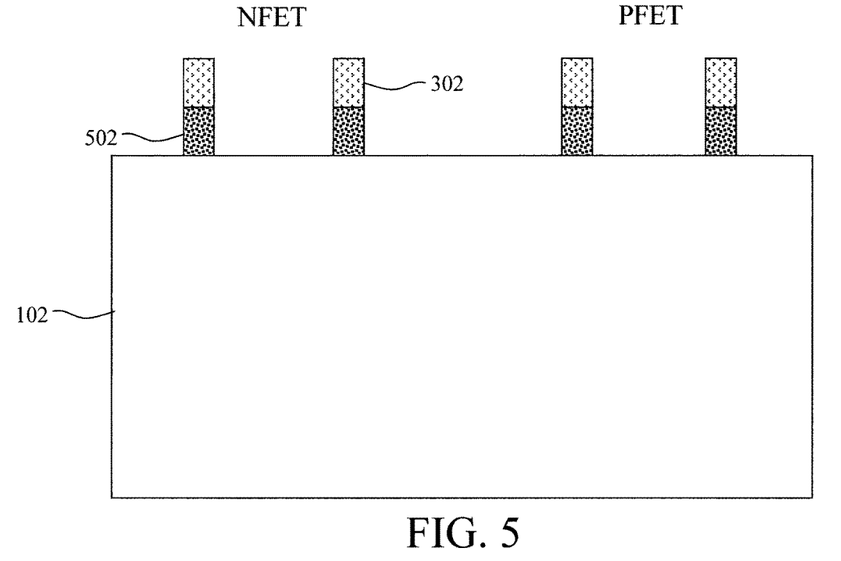
FIG. 5 is a cross-sectional diagram illustrating the spacers having been used to pattern the hardmask layer into individual fin hardmasks according to an embodiment of the present invention.

As shown in FIG. 1, the process begins with an undoped substrate 102. A variety of different substrate 102 configurations can be implemented in accordance with the present techniques. For instance, according to one exemplary embodiment, the starting substrate 102 is a bulk semiconductor wafer, such as a bulk silicon (Si), bulk germanium (Ge), bulk silicon germanium (SiGe) and/or bulk III-V semiconductor wafer. Alternatively, substrate 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor.

Fins (patterned in substrate 102) will serve as the basis for forming at least on NFET in a first region of the substrate 102 (labeled "NFET") and at least one PFET in a second region of the substrate 102 (labeled "PFET"). Standard lithography and etching techniques can be implemented to directly pattern the fins. However, other patterning techniques are also contemplated herein. For instance, a sidewall image transfer (SIT) technique is shown illustrated in the figures. Advantageously, SIT permits the patterning of feature sizes below what can be achieved using direct patterning. As such, SIT allows for patterning fins at a sub-lithographic pitch.

As shown in FIG. 1, a hardmask layer 104 is formed on the substrate 102. The hardmask layer 104 will serve as the basis for patterning individual fin hardmasks on the substrate 102 marking the footprint and location of the fins. Suitable hardmask materials include, but are not limited to, nitride hardmask materials such as silicon nitride (SiN) and/or silicon oxynitride (SiON).

For SIT, at least one mandrel 202 is next formed on the hardmask layer 104. See FIG. 2. The mandrels 202 are a sacrificial structure used to place sidewall spacers for fin hardmask patterning. Thus, the mandrels 202 are formed from a material that can be selectively removed relative to the spacers, such as amorphous silicon, poly-silicon, amorphous carbon, silicon germanium (SiGe), an organic planarization layer (OPL), silicon dioxide ($SiO_2$) and/or SiN. The mandrel material is deposited onto the hardmask layer 104 and then standard lithography and etching techniques are used to pattern the mandrel material into the individual mandrels 202.

Following patterning of the mandrels 202, sidewall spacers 302 are formed on opposite sides of the mandrels 202. See FIG. 3. By way of example only, a suitable spacer material is blanket deposited onto and covering the mandrels 202. The spacer material is then patterned into the individual spacers 302 using, e.g., a directional etching process such as reactive ion etching (RIE). Suitable materials for spacers 302 include, but are not limited to, $SiO_2$, SiN, SiON, silicon carbide (SiC) and/or amorphous carbon. However, as provided above, the mandrels 202 will be removed selective to the spacers 302. Thus, the choice of mandrel and spacer material should be made to permit this etch selectivity. For instance, when the mandrels 104 are formed from an nitride material such as SiN, the spacers 302 can be formed from an oxide material (such as $SiO_2$), or vice versa. As such, a nitride- or oxide-selective etch can be used to remove one (nitride or oxide) material relative to the other.

The mandrels 202 are then removed selective to the spacers 302. See FIG. 4. As such, the spacers 302 are left behind as masks for patterning the underlying hardmask layer 104 (into the individual fin hardmasks). It is notable that the SIT process described herein is a pitch doubling technique. Namely, there are now two spacers 302 for every mandrel 202 originally patterned on the hardmask layer 104.

The spacers 302 are then used to pattern the hardmask layer 104 into individual fin hardmasks 502, at least one of the fin hardmasks 502 being in the NFET region of the substrate 102 and at least another of the fin hardmasks 502 being in the PFET region of the substrate 102. See FIG. 5. As provided above, the fin hardmasks 502 mark the footprint and location of the fins. The spacers 302 can then be removed.

Figure 6:
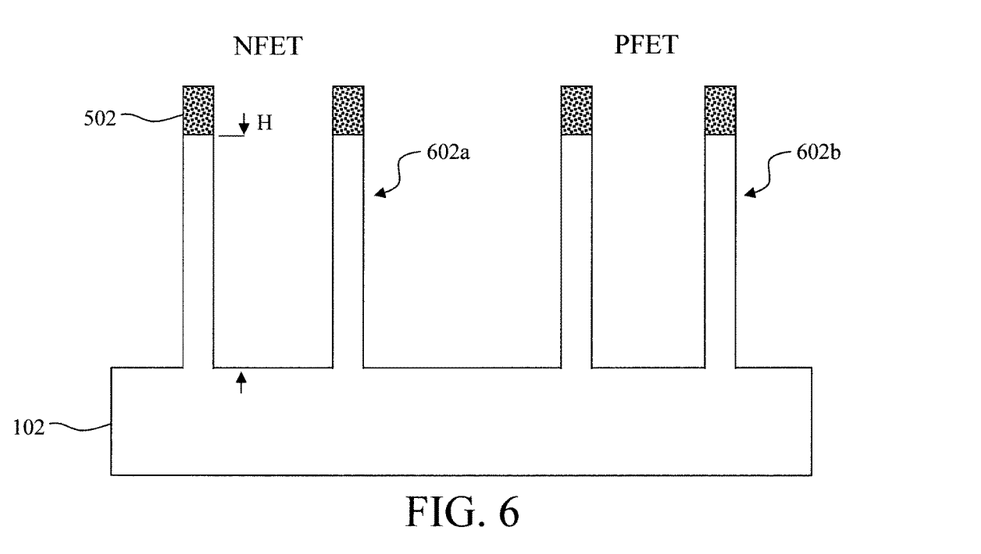
FIG. 6 is a cross-sectional diagram illustrating the fin hardmasks having been used to pattern n-channel field effect transistor (NFET) and p-channel FET (PFET) fins in the substrate according to an embodiment of the present invention.

The fin hardmasks 502 are then used to pattern fins in the substrate 102. As shown in FIG. 6, the fins include at least one first fin 602a patterned in the NFET region of the substrate 102 and at least one second fin 602b patterned in the PFET region of the substrate. As such, the first fins 602a will serve as the basis for forming at least one NFET, and the second fins 602b will serve as the basis for forming at least one PFET in the present VFET device.

A directional etching process such as RIE can be used for the fin etch. As shown in FIG. 6, the fins 602a and 602b, as patterned, extend only partway through the substrate 102. It is also notable that the fins 602a and 602b are patterned concurrently and thus all have the same fin height H.

Bottom source and drains are next formed at the base of the fins 602a and 602b. Being that both NFETs and PFETs are being co-fabricated on the same wafer, dopants of a different polarity are needed in each device. To allow selective processing of one device and then the other, in this example a block mask 702 is first formed selectively covering either the NFET or PFET. See FIG. 7. In this particular example, the PFET is covered first while the NFET bottom source and drains are formed. This is however arbitrary as the order in which the NFET or PFET bottom source and drains are formed is inconsequential.

Figure 7:
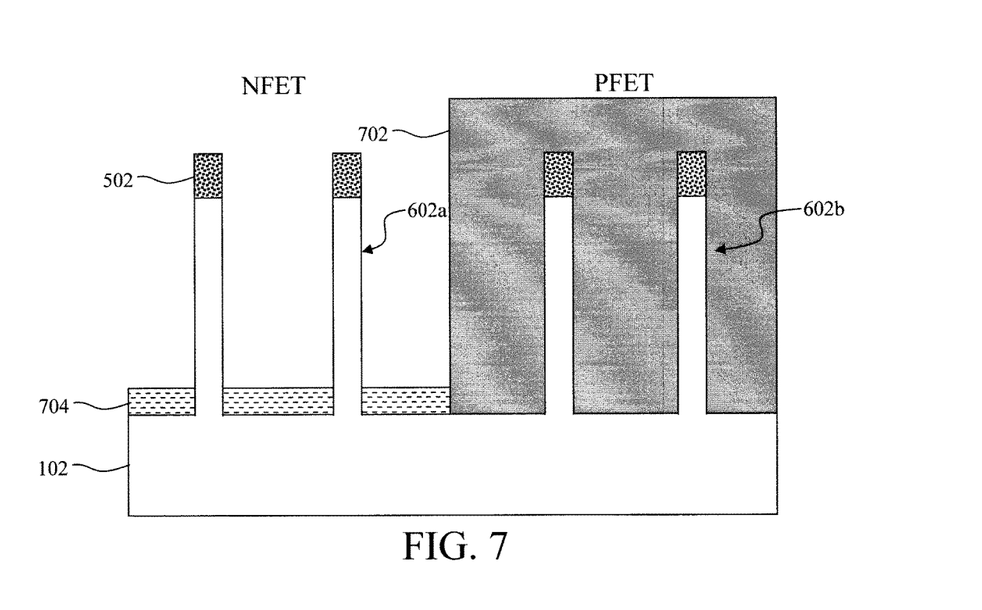
FIG. 7 is a cross-sectional diagram illustrating a block mask having been formed selectively covering the PFET fins and NFET bottom source and drains having been formed selectively at the base of the NFET fins according to an embodiment of the present invention.

As shown in FIG. 7, now only the NFET is exposed, and bottom source and drains 704 are formed selectively at the base of the fins 602a. According to an exemplary embodiment, the bottom source and drains 704 are formed from an in-situ n-type doped (i.e., during growth) or ex-situ n-type doped (i.e., via a process such as ion implantation) epitaxial material. Suitable epitaxial materials include, but are not limited to, epitaxial Si, Ge and/or SiGe. Suitable n-type dopants include phosphorous (P) and/or arsenic (As). According to an exemplary embodiment, the bottom source and drains 704 are formed from in-situ phosphorous (P)-doped Si (Si:P).

Other techniques however are also contemplated herein for forming the bottom source and drains 704. For instance, the bottom source and drains 704 can instead be formed using ion implantation of an n-type dopant(s) into the substrate 102 beneath the fins 602a. As provided above, suitable n-type dopants include phosphorous (P) and/or arsenic (As).

Figure 8:
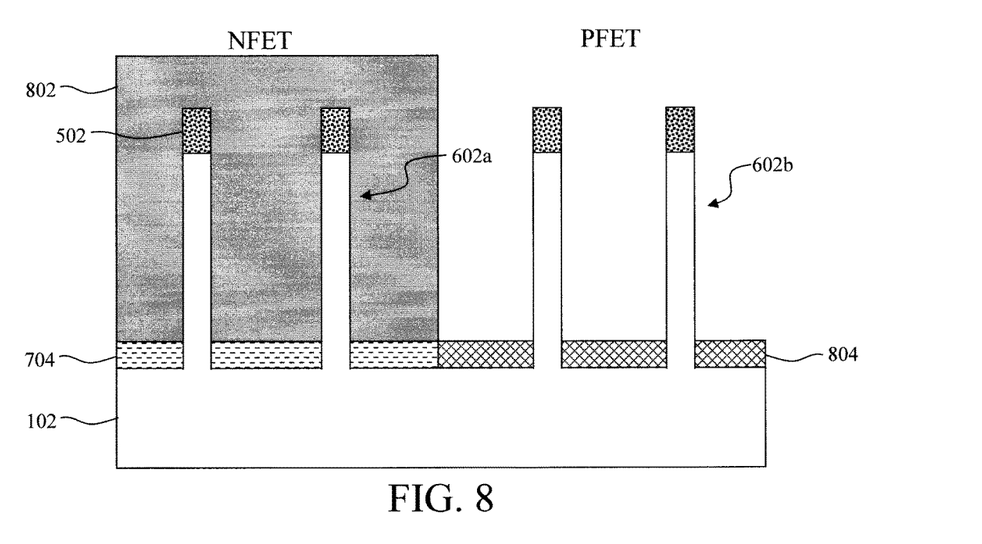
FIG. 8 is a cross-sectional diagram illustrating a block mask having been formed selectively covering the NFET fins and PFET bottom source and drains having been formed selectively at the base of the PFET fins according to an embodiment of the present invention.

Following formation of the bottom source and drains 704, the block mask 702 is removed and the process is repeated to selectively form bottom source and drains 804 at the base of the fins 602b in the PFET region of the substrate 102. See FIG. 8. Specifically, as shown in FIG. 8 a block mask 802 is now formed covering the fins 602a, leaving the fins 602b exposed. Again, the order in which the NFET and PFET bottom source and drains 704 and 804 is formed is immaterial.

According to an exemplary embodiment, the bottom source and drains 804 are formed from an in-situ p-type doped (i.e., during growth) or ex-situ p-type doped (i.e., via a process such as ion implantation) epitaxial material. Suitable epitaxial materials include, but are not limited to, epitaxial Si, Ge and/or SiGe. Suitable p-type dopants include boron (B). According to an exemplary embodiment, the bottom source and drains 804 are formed from in-situ boron (B)-doped SiGe (SiGe:B).

Other techniques however are also contemplated herein for forming the bottom source and drains 804. For instance, the bottom source and drains 804 can instead be formed using ion implantation of an n-type dopant(s) into the substrate 102 beneath the fins 602*b*. As provided above, suitable n-type dopants include boron (B).

Figure 9:
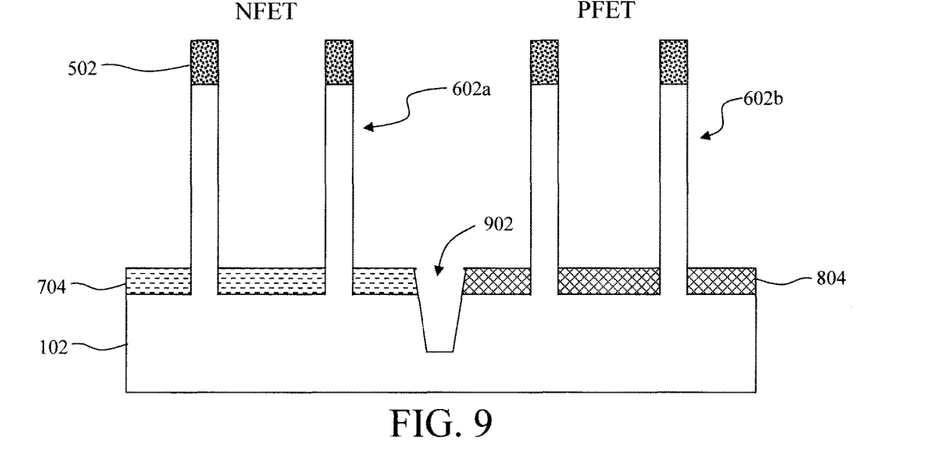
FIG. 9 is a cross-sectional diagram illustrating a trench having been patterned in the substrate separating the NFET bottom source and drains from the PFET bottom source and drains according to an embodiment of the present invention.

Following formation of the bottom source and drains 804, the block mask 802 is removed. Shallow trench isolation (STI) is then used to isolate the NFET fins 602*a* from the NFET fins 602*b*. For instance, as shown in FIG. 9 a trench 902 is patterned in the substrate 102 between the fins 602*a* and 602*b*. The trench 902 separates the bottom source and drains 704 from the bottom source and drains 804.

Figure 10:
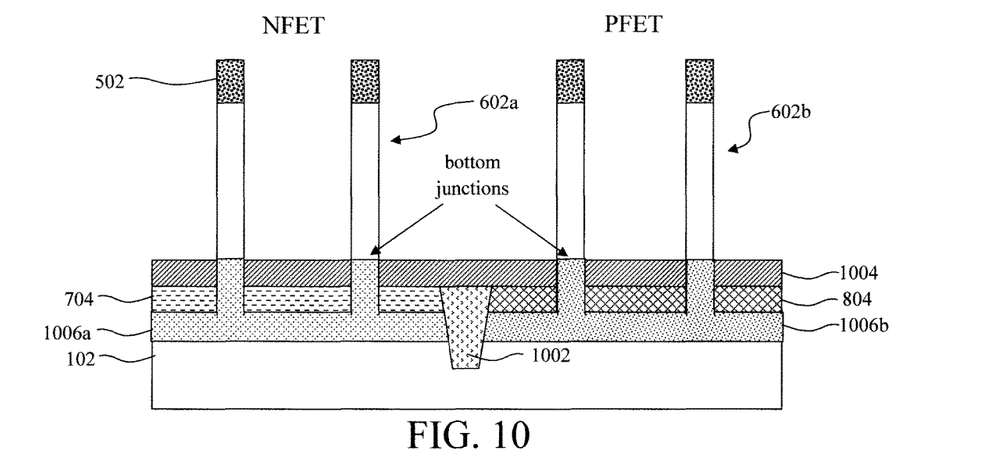
FIG. 10 is a cross-sectional diagram illustrating the trench having been filled with an insulator, bottom spacers having been formed on the NFET and PFET bottom source and drains, and a drive-in anneal having been performed to drive in dopants from the NFET and PFET bottom source and drains into the NFET and PFET fins forming NFET and PFET bottom source and drain extensions according to an embodiment of the present invention.

The trench 902 is then filled with an insulator 1002. See FIG. 10. As shown in FIG. 10, as deposited, any excess insulator 1002 is removed using a process such as chemical-mechanical polishing (CMP). As a result, the top surface of insulator 1002 is coplanar with the top surface of the bottom source and drains 704 and 804. Suitable insulators 1002 include, but are not limited to oxide materials such as $SiO_2$. When the insulator 1002 is an oxide, it is also generically referred to herein as an STI oxide.

Bottom spacers 1004 are then formed on the NFET bottom source and drains 704/PFET bottom source and drains 804 at the base of fins 602*a* and 602*b*, respectively. See FIG. 10. The bottom spacers 1004 (and counterpart top spacers—see above) serve to offset the gate (which will be formed alongside the fins 602*a* and 602*b*) from the bottom source and drains 704 and 804 and from the top source and drains, respectively.

Suitable materials for the first bottom spacers 1004 include, but are not limited to, oxide spacer materials such as $SiO_2$ and/or silicon carbon oxide (SiCO), and nitride spacer materials such as SiN, silicon boron carbon nitride (SiBCN), silicon oxycarbon nitride (SiOCN), and/or silicon carbon nitride (SiCN). According to an exemplary embodiment, the bottom spacers 1004 are formed using a directional deposition process whereby the spacer material is deposited onto the NFET bottom source and drains 704/PFET bottom source and drains 804 and fins 602*a*/602*b* with a greater amount of the spacer material being deposited on horizontal surfaces (including on top of the bottom source and drains 704 and 804), as compared to vertical surfaces (such as along sidewalls of the fins 602*a* and 602*b*). Thus, when an etch is used on the spacer material, the timing of the etch needed to remove the spacer material from the vertical surfaces will leave the bottom spacers 1004 shown in FIG. 10 on the bottom source and drains 704 and 804 since a greater amount of the spacer material was deposited on these (horizontal) surfaces to begin with. By way of example only, a high density plasma (HDP) chemical vapor deposition (CVD) or physical vapor deposition (PVD) process can be used for directional film deposition, and an oxide- or nitride-selective (depending on the spacer material) isotropic etch can be used to remove the (thinner) spacer material deposited onto the vertical surfaces.

A drive-in anneal can then be performed to drive in dopants from the NFET bottom source and drains 704 and the PFET bottom source and drains 804 into the fins 602*a* and 602*b* forming bottom source and drain extensions 1006*a* and 1006*b*, respectively. See FIG. 10. According to an exemplary embodiment, this drive-in anneal is performed at a temperature of from about 400° C. to about 1300° C., and ranges therebetween. It is notable that these high temperatures are permitted at this stage in the process since the (high-κ metal) gate is not yet in place. As shown in FIG. 10, this drive-in anneal establishes the bottom junction between the vertical fin channel and the NFET bottom source and drains 704/PFET bottom source and drains 804. The vertical fin channel is the portion of the fins 602*a* and 602*b* alongside the gate. See below.

While the drive-in anneal for the bottom source and drain extensions 1006*a*/1006*b* can be performed at temperatures sufficient to align the bottom junction with the gate, the low thermal budget after the high-κ metal gate has been formed prevents the same drive-in annealing process from being performed for the top junction. As a result, an undoped region will be left at the top of the fins in between the vertical fin channel and the top source and drain extensions. It is this undoped region at the tops of the fins which the present techniques address by forming a surface dipole to enhance carrier transport.

Gates (i.e., gate dielectric and gate conductor) are next formed along sidewalls of the fins 602*a* and 602*b*. According to an exemplary embodiment, a high-κ metal gate is formed. Since both NFETs and PFETs are being co-fabricated on the same wafer, different gate metals (i.e., N or P gate metals) are needed in each device. To allow selective processing of one device and then the other, in this example a block mask 1102 is first formed selectively covering either the NFET or PFET. See FIG. 11. In this particular example, the PFET is covered first while the NFET high-κ metal gate is formed. This is however arbitrary as the order in which the NFET or PFET gates are formed is inconsequential.

Figure 11:
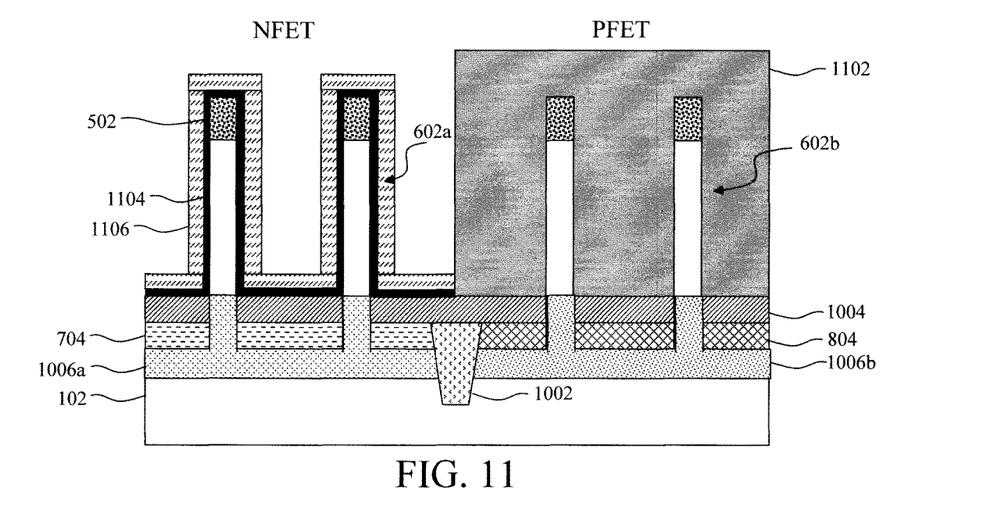
FIG. 11 is a cross-sectional diagram illustrating a block mask having been formed selectively covering the PFET fins, a conformal gate dielectric having been deposited over the NFET fins, followed by an NFET conformal gate conductor to form NFET gates according to an embodiment of the present invention.

As shown in FIG. 11, the NFET gate is formed by depositing a conformal gate dielectric 1104 over the fins 602*a*, followed by a conformal gate conductor 1106. According to an exemplary embodiment, the gate conductor 1106 is a metal or combination of metals and the gate dielectric 1104 is a high-κ dielectric. For instance, the gate conductor 1106 is an n-type workfunction setting metal for the NFETs. Suitable n-type workfunction setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC).

The term "high-κ" as used herein refers to a material having a relative dielectric constant κ which is much higher than that of silicon dioxide (e.g., a dielectric constant κ=25 for hafnium oxide ($HfO_2$) rather than 4 for silicon dioxide). Suitable high-κ gate dielectrics include, but are not limited to, $HfO_2$ and/or lanthanum oxide ($La_2O_3$).

According to an exemplary embodiment, the gate dielectric 1104 and the gate conductor 1106 are both deposited using a process such as atomic layer deposition (ALD) or chemical vapor deposition (CVD). By way of example only, the gate dielectric 1104 is deposited to a thickness of from about 2 Angstroms (Å) to about 10 nm and ranges therebetween, and the gate conductor 1106 is deposited to a thickness of from about 3 nm to about 11 nm and ranges therebetween.

Figure 12:
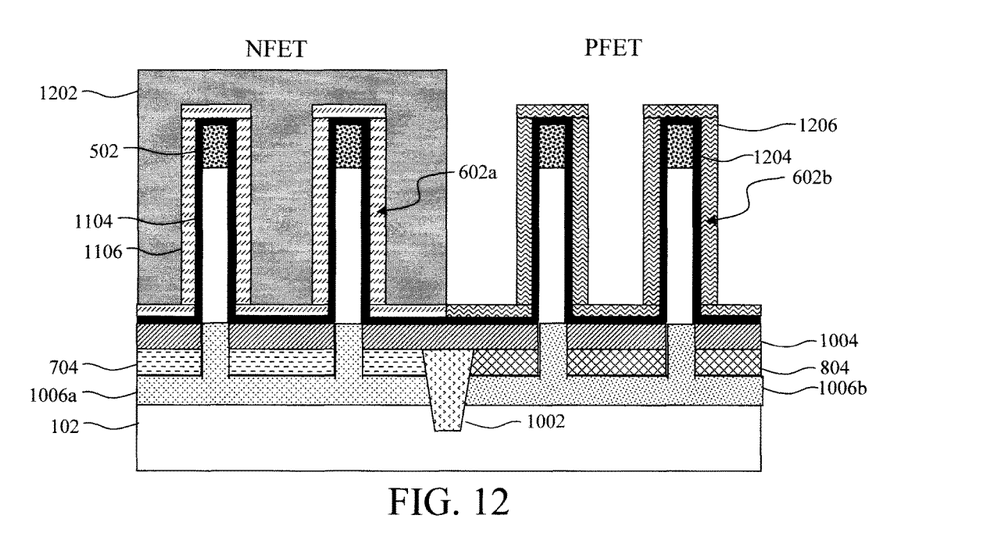
FIG. 12 is a cross-sectional diagram illustrating a block mask having been formed selectively covering the NFET fins, a conformal gate dielectric having been deposited over the PFET fins, followed by an PFET conformal gate conductor to form PFET gates according to an embodiment of the present invention.

Following formation of the NFET gates, the block mask 1102 is removed and the process is repeated to selectively form PFET gates along the sidewalls of the fins 602b. See FIG. 12. Specifically, as shown in FIG. 12 a block mask 1202 is now formed covering the fins 602a, leaving the fins 602b exposed. Again, the order in which the NFET and PFET gates are formed is immaterial.

As shown in FIG. 12, the PFET gate is formed by depositing a conformal gate dielectric 1204 over the fins 602b, followed by a conformal gate conductor 1206. According to an exemplary embodiment, the gate conductor 1206 is a metal or combination of metals and the gate dielectric 1204 is a high-κ dielectric. For instance, the gate conductor 1206 is a p-type workfunction setting metal for the NFETs. Suitable p-type workfunction setting metals include, but are not limited to, TiN, TaN, and/or tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above. As provided above, suitable high-κ gate dielectrics include, but are not limited to, $HfO_2$ and/or $La_2O_3$.

The block mask 1202 is then removed. As shown in FIG. 12, the NFET and PFET gates surround at least a portion of each of the fins 602a and 602b. It is notable that while cross-sectional views are depicted in the figures, the gates (i.e., gate dielectrics 1104/1204 and gate conductors 1106/1206) are continuous around the sidewalls of the fins 602a/602b. This configuration is referred to herein as a gate-all-around configuration or GAA.

Figure 13:
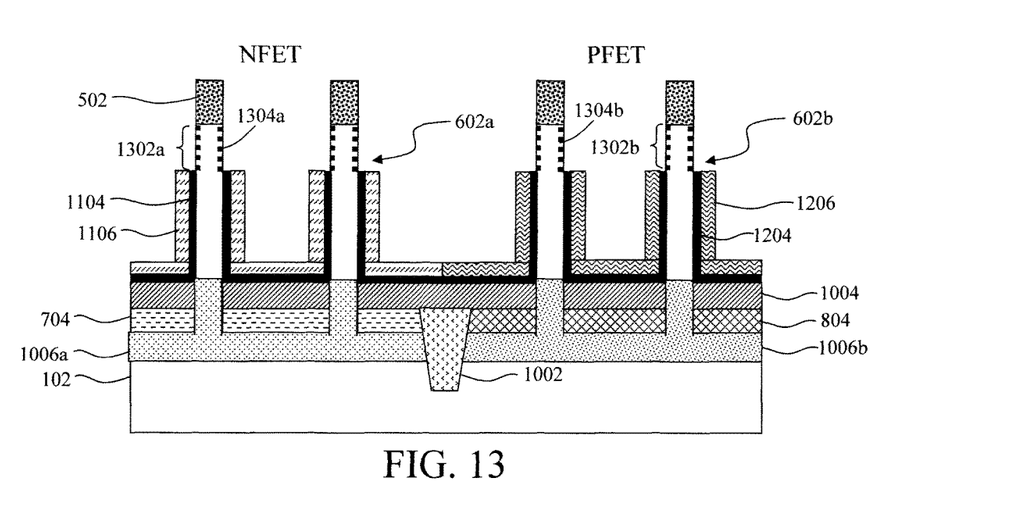
FIG. 13 is a cross-sectional diagram illustrating a recess etch of the NFET and PFET gates having been performed to expose the tops of the NFET and PFET fins, and native oxide layers having been formed along the sidewalls of the top portions of the NFET and PFET fins according to an embodiment of the present invention.

A recess etch of the NFET and PFET gates is then performed to expose the tops of the fins 602a and 602b. See FIG. 13. As shown in FIG. 13, the gate dielectrics 1104/1204 and gate conductors 1106/1206 have been recessed below the fin hardmasks 502, exposing top portions 1302a and 1302b of fins 602a and 602b, respectively.

Native oxide layers 1304a and 1304b are then formed along the sidewalls of the portions 1302a and 1302b of fins 602a and 602b. See FIG. 13. By 'native oxide' it is meant that the layers 1304a and 1304b are an oxide of the same material as the fins 602a and 602b. Thus, for instance, if the fins 602a and 602b are Si, then the native oxide would be $SiO_2$. According to an exemplary embodiment, oxide layers 1304a and 1304b are formed using a standard oxidation process to a thickness of from about 0.3 nanometers (nm) to about 5 nm, and ranges therebetween, e.g., about 1 nm. The native oxide makes the dipole formation. Namely, if there is one pole at one side of the native oxide, then there is an opposite pole at the other side.

A first layer having a positive (+) charge will be placed over the NFET fins 602a to induce an opposite (i.e., negative) charge in the portions of 1302a of fins 602a, and a second layer having a negative (−) charge will be placed over the PFET fins 602b to induce an opposite (i.e., a positive) charge in the portions 1302b of fins 602b. To allow selective placement of the first/second charged layers in the NFETs and PFETs, respectively, the first charged layer will be blanket deposited over both NFET and PFET devices and then selectively removed from the PFETs. The process is then repeated for the PFET, whereby the second charged layer is blanket deposited over both NFET and PFET devices and then selectively removed from the NFETs. In this particular example, the NFET is processed first, followed by the PFET. This is however arbitrary as the order in which dipole formation is carried out in the NFETs or PFETs is inconsequential.

Figure 14:
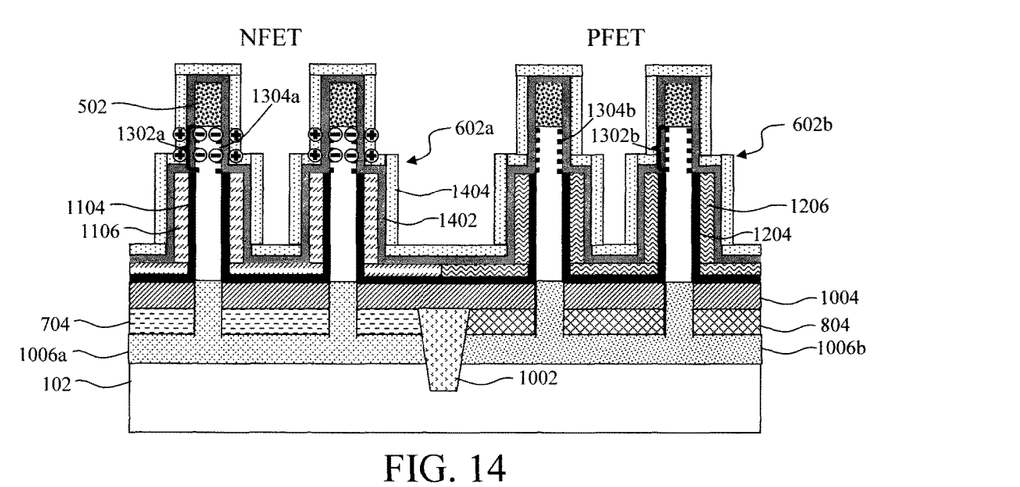
FIG. 14 is a cross-sectional diagram illustrating a first charged layer having been deposited over the NFET and PFET fins, and a thin capping layer having been deposited over the first charged layer according to an embodiment of the present invention.

As shown in FIG. 14, a first charged layer 1402 is deposited conformally over the NFET and PFET fins 602a and 602b. According to an exemplary embodiment, the first charged layer 1402 has a positive charge. As provided above, suitable materials having a positive charge include, but are not limited to, SrO, $La_2O_3$, $Lu_2O_3$ and/or $Y_2O_3$. In one exemplary non-limiting embodiment, the first charged layer 1402 is $La_2O_3$. According to an exemplary embodiment, the first charged layer 1402 is deposited using a deposition process such as atomic layer deposition (ALD) or chemical vapor deposition (CVD) to a thickness of from about 2 angstroms (Å) to about 5 Å and ranges therebetween.

As deposited, the first charged layer 1402 is in direct contact with the oxide layers 1302a along the sidewalls of the portions 1302a of fins 602a. As shown in FIG. 14, the positive charge in layer 1402 induces a negative charge along the surfaces of the portions 1302a of fins 602a. This surface dipole will enhance carrier transport along the (undoped) portions 1302a at the tops of the NFET fins 602a.

The process is then repeated on the PFET side to form a second different charged layer (with opposite polarity, i.e., negative vs. positive) for the PFETs. First, however, a thin capping layer 1404 is deposited over the first charged layer 1402. This capping layer 1404 will protect the first charged layer 1402 during selective removal of the second charged layer from the NFETs (see below).

Suitable materials for capping layer 1404 include, but are not limited to, nitride materials such as SiN, SiBCN, SiOCN and/or SiCN. According to an exemplary embodiment, the capping layer 1404 is deposited using a deposition process such as ALD or CVD to a thickness of from about 2 nanometers (nm) to about 4 nm and ranges therebetween.

The first charged layer 1402 is then selectively removed from the PFET fins 602b. To do so, a block mask 1502 is formed over the NFET fins 602a and covering the capping layer 1404 and the first charged layer 1402. See FIG. 15. The capping layer 1404 and the first charged layer 1402 are exposed over the PFET fins 602b.

Figure 15:
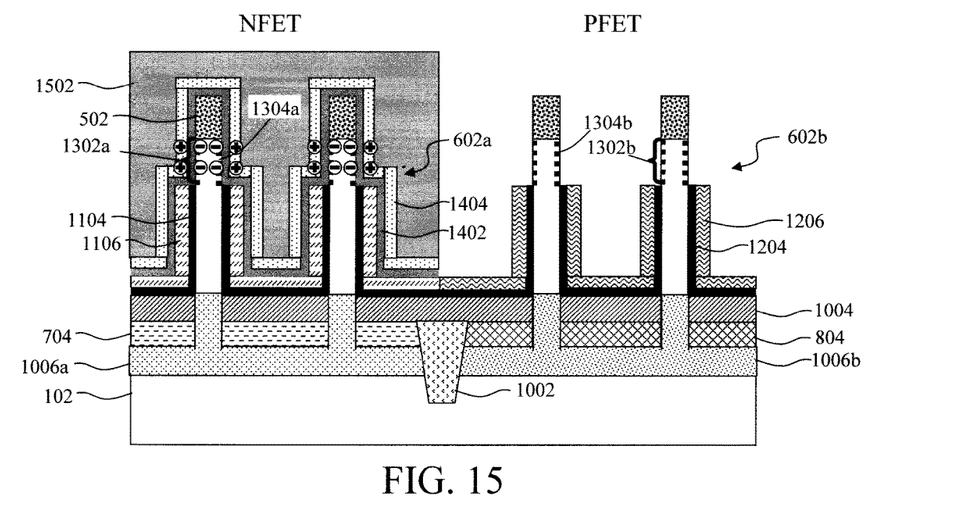
FIG. 15 is a cross-sectional diagram illustrating a block mask having been formed over the NFET fins and covering the capping layer and the first charged layer, and an etch having been used to selectively remove the capping layer and the first charged layer from the PFET fins according to an embodiment of the present invention.

An etch is then performed to (selectively) remove the capping layer 1404 and the first charged layer 1402 from the PFET fins 602b. By way of example only, if the capping layer 1404 is SiN and the first charged layer 1402 is $La_2O_3$, then a nitride-selective RIE step followed by an oxide-selective RIE step can be used to remove the capping layer 1404 and the first charged layer 1402 from the PFET fins 602b. The native oxide should not be affected by this process. However, any of the native oxide that inadvertently gets removed can be replaced via an oxidation process.

Figure 16:
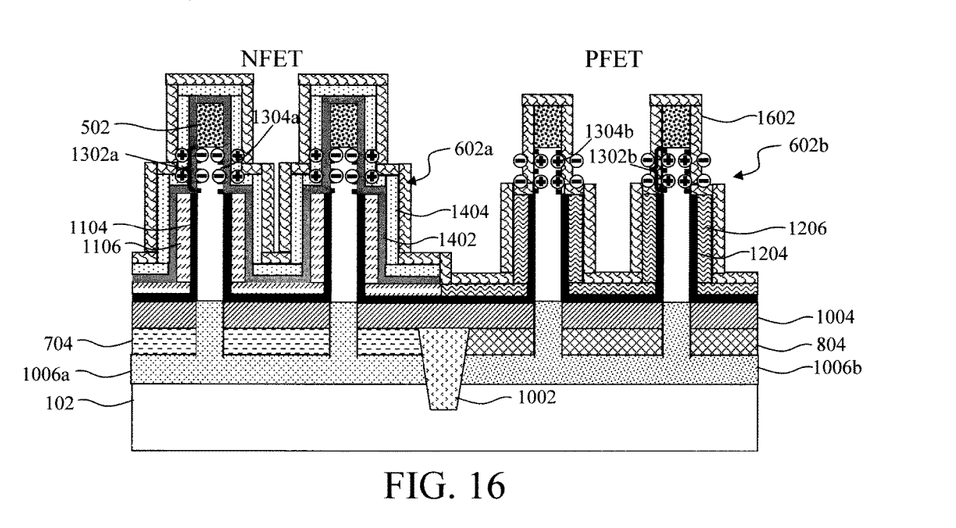
FIG. 16 is a cross-sectional diagram illustrating a second charged layer having been deposited over the NFET and PFET fins according to an embodiment of the present invention.

As shown in FIG. 16, a second charged layer 1602 is deposited conformally over the NFET and PFET fins 602a and 602b. According to an exemplary embodiment, the second charged layer 1602 has a negative (−) charge. As provided above, suitable materials having a negative charge include, but are not limited to, $Al_2O_3$, $TiO_2$, $ZrO_2$, $HfO_2$ and/or MgO. In one exemplary non-limiting embodiment, the second charged layer 1602 is $Al_2O_3$. According to an exemplary embodiment, the second charged layer 1602 is deposited using a deposition process such as ALD or CVD to a thickness of from about 2 Å to about 5 Å and ranges therebetween.

As deposited, the first charged layer 1602 is in direct contact with the oxide layers 1302b along the sidewalls of the portions 1302b of fins 602b. As shown in FIG. 16, the negative charge in layer 1602 induces a positive charge along the surfaces of the portions 1302b of fins 602b. This surface dipole will enhance carrier transport along the (undoped) portions 1302b at the tops of the fins 602b.

The second charged layer 1602 is then selectively removed from the NFET fins 602a. To do so, a block mask 1702 is formed over the PFET fins 602b and covering the second charged layer 1602. See FIG. 17. The second charged layer 1602 is exposed over the NFET fins 602a. The capping layer 1404 is however present over the fins 602a, protecting the first charged layer 1402.

Figure 17:
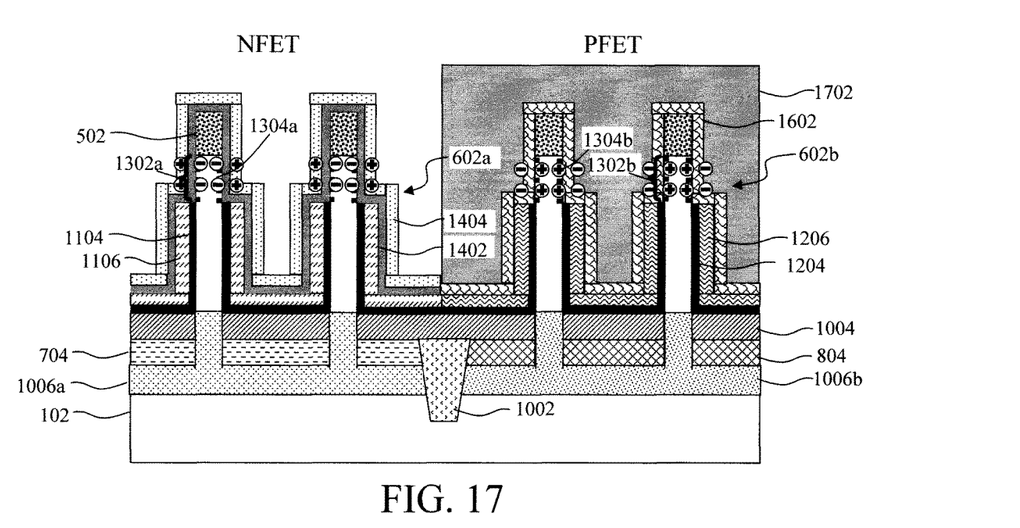
FIG. 17 is a cross-sectional diagram illustrating a block mask having been formed over the PFET fins and covering the second charged layer, and an etch having been used to selectively remove the second charged layer from the NFET fins according to an embodiment of the present invention.

An etch is then performed to (selectively) remove the second charged layer 1602 from the NFET fins 602a. By way of example only, if the second charged layer 1602 is $Al_2O_3$, then an oxide-selective RIE can be used to remove the second charged layer 1602 from the NFET fins 602a. As provided above, the capping layer 1404 will protect the underlying first charged layer 1402 during this RIE. Following the etch, the block mask 1702 is removed.

Figure 18:
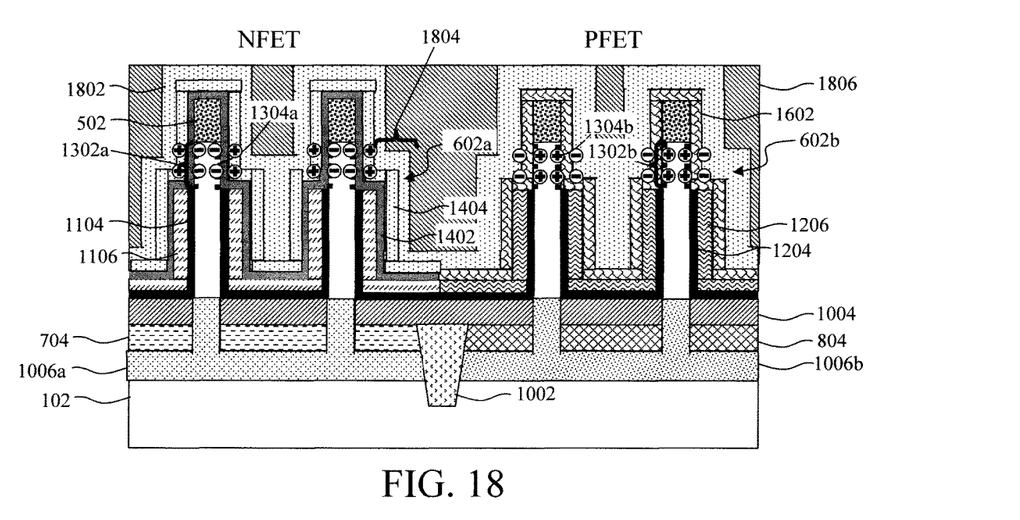
FIG. 18 is a cross-sectional diagram illustrating an encapsulation layer having been deposited over the NFET and PFET fins, i.e., onto the capping layer in the NFETs and onto the second charged layer in the PFETs, wherein the encapsulation layer provides top spacers above the NFET and PFET gates, and an oxide fill material having been blanket deposited over the NFETs and PFETS according to an embodiment of the present invention.

An encapsulation layer 1802 is then deposited over the NFET/PFET fins 602a/602b onto the capping layer 1404 in the NFETs and the second charged layer 1602 in the PFETs. See FIG. 18. Suitable materials for encapsulation layer 1802 include, but are not limited to, nitride materials such as SiN, SiBCN, SiOCN and/or SiCN. Thus, as shown in FIG. 18, the capping layer 1404 and the encapsulation layer 1802 can be formed from a common material and thus merge into a single layer. According to an exemplary embodiment, the encapsulation layer 1802 is deposited using a deposition process such as ALD or CVD to a thickness sufficient to completely fill the spaces between adjacent NFET fins 602a and adjacent PFET fins 602b. See FIG. 18. As shown in FIG. 18, the formation of encapsulation layer 1802 provides top spacers 1804 above the NFET and PFET gates. As provided above, the bottom spacers 1004 and the top spacers 1804 offset the gates from the bottom source and drains and the top source and drains.

An oxide fill material 1806 is then blanket deposited over the NFETs and PFETs, filling in the spaces between fins 602a and 602b. As shown in FIG. 18, as deposited, any excess oxide fill material 1806 is removed using a process such as CMP. As a result, the top surface of oxide fill material 1806 is coplanar with the top surface of the encapsulation layer 1802. Suitable oxide fill materials 1806 include, but are not limited to, $SiO_2$.

Figure 19:
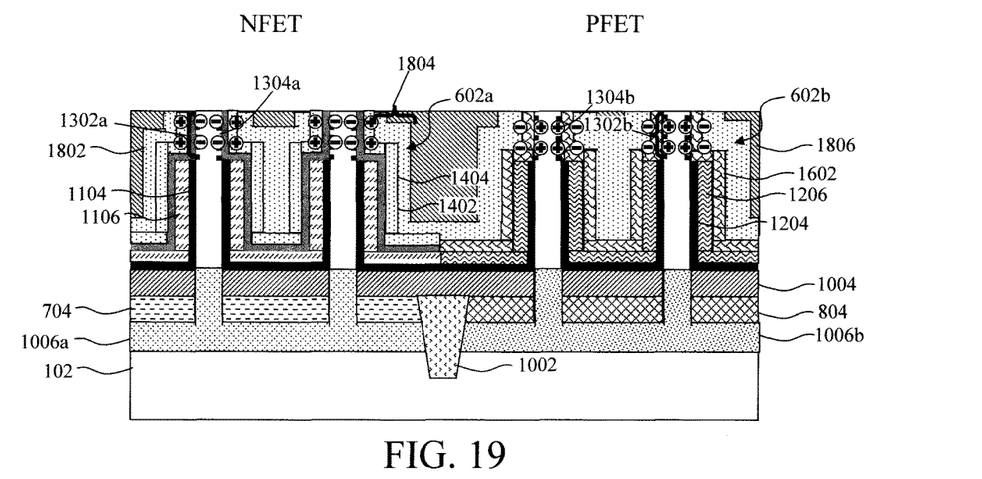
FIG. 19 is a cross-sectional diagram illustrating the encapsulation layer, the oxide fill material, the (NFET) capping layer and first charged layer, and the (PFET) second charged layer having been recessed along with the fin hardmasks to expose tops of the NFET and PFET fins according to an embodiment of the present invention.
Figure 20:
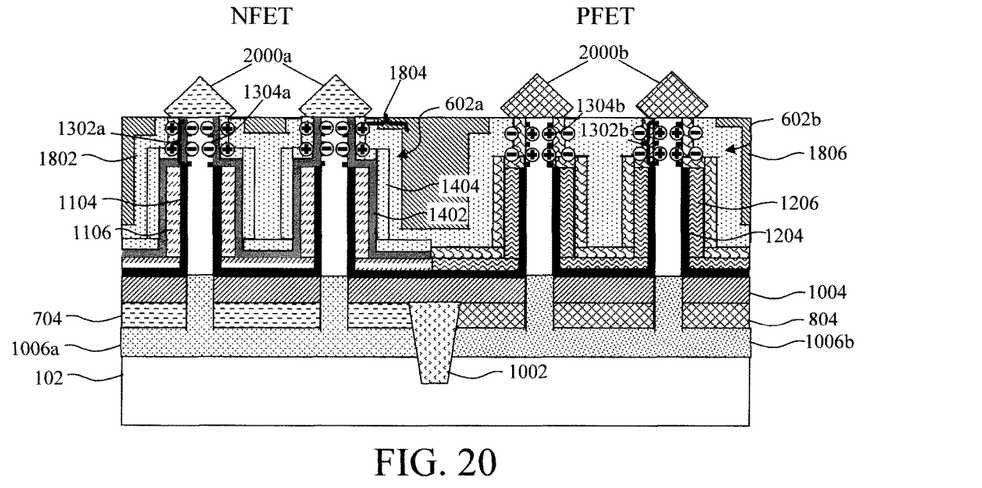
FIG. 20 is a cross-sectional diagram illustrating NFET and PFET top source and drains having been formed on the exposed tops of the NFET and PFET fins above the top spacers according to an embodiment of the present invention.

Access in now needed to the tops of the fins 602a and 602b for top source and drain formation. Thus, as shown in FIG. 19, the encapsulation layer 1802, the oxide fill material 1806, the (NFET) capping layer 1404 and first charged layer 1402, and the (PFET) second charged layer 1602 are recessed along with the fin hardmasks 502. As a result, the tops of the fins 602a and 602b are now exposed. This recess etch can be performed using a process such as CMP.

Top source and drains 2000a and 2000b are then formed on the (now-exposed) tops of NFET fins 602a and PFET fins 602b, respectively, above the top spacers 1804. See FIG. 20. According to an exemplary embodiment, the top source and drains 2000a and 2000b are formed from an in-situ doped (i.e., during growth) or ex-situ doped (i.e., via a process such as ion implantation) epitaxial material. Suitable epitaxial materials include, but are not limited to, epitaxial Si, Ge and/or SiGe. By way of example only, the top source and drains 2000a are doped with an n-type dopant and the top source and drains 2000b are doped with a p-type dopant As provided above, suitable n-type dopants include phosphorous (P) and/or arsenic (As), and suitable p-type dopants include, but are not limited to, boron (B). According to an exemplary embodiment, the top source and drains 2000a are formed from in-situ doped Si:P and the top source and drains 2000b are formed from in-situ doped SiGe:B.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a vertical field effect transistor (VFET) device, the method comprising the steps of:
   patterning at least one fin in a substrate;
   forming bottom source and drains at a base of the at least one fin;
   forming bottom spacers on the bottom source and drains;
   forming a gate along sidewalls of the at least one fin;
   recessing the gate to expose a top portion of the at least one fin;
   forming a native oxide layer along the sidewalls of the top portion of the at least one fin;
   depositing a charged layer over the at least one fin in direct contact with the native oxide layer, wherein the charged layer induces an opposite charge in the top portion of the at least one fin forming a dipole;
   forming top spacers above the gate; and
   forming top source and drains above the top spacers.

2. The method of claim 1, wherein the charged layer has a positive charge.

3. The method of claim 2, wherein the charged layer is formed from a material selected from the group consisting of: strontium oxide (SrO), lanthanum oxide ($La_2O_3$), lutetium oxide ($Lu_2O_3$), yttrium oxide ($Y_2O_3$), and combinations thereof.

4. The method of claim 1, wherein the charged layer has a negative charge.

5. The method of claim 4, wherein the charged layer is formed from a material selected from the group consisting of: aluminum oxide ($Al_2O_3$), titanium oxide ($TiO_2$), zirconium oxide ($ZrO_2$), hafnium oxide ($HfO_2$), magnesium oxide (MgO), and combinations thereof.

6. The method of claim 1, wherein the step of forming the gate comprises the step of:
   depositing a conformal gate dielectric over the at least one fin; and
   depositing a conformal gate conductor over the conformal gate dielectric.

7. The method of claim 6, wherein the conformal gate dielectric comprises a high-κ material selected from the group consisting of: hafnium oxide ($HfO_2$), lanthanum oxide ($La_2O_3$), and combinations thereof.

8. The method of claim 6, wherein conformal gate conductor comprises a workfunction setting metal selected from the group consisting of: titanium nitride (TiN), tantalum nitride (TaN), aluminum (Al)-containing alloys, titanium aluminide (TiAl), titanium aluminum nitride (TiAlN), titanium aluminum carbide (TiAlC), tantalum aluminide (TaAl), tantalum aluminum nitride (TaAlN), tantalum aluminum carbide (TaAlC), tungsten (W), and combinations thereof.

* * * * *